United States Patent
Kapila et al.

(10) Patent No.: US 12,349,316 B2
(45) Date of Patent: Jul. 1, 2025

(54) THERMAL CONDUCTION BAND FOR IMPROVED MOBILE COMPUTING DEVICE PERFORMANCE

(71) Applicant: Intel Corporation, Santa Clara, CA (US)

(72) Inventors: Smit Kapila, Bangalore (IN); V M K Sarma Vedhanabhatla, Bangalore (IN); Vikas Kundapura Rao, Udupi (IN); David Rittenhouse, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 258 days.

(21) Appl. No.: 17/955,839

(22) Filed: Sep. 29, 2022

(65) Prior Publication Data

US 2023/0035081 A1    Feb. 2, 2023

Related U.S. Application Data

(60) Provisional application No. 63/306,491, filed on Feb. 3, 2022.

(51) Int. Cl.
| | |
|---|---|
| *H05K 7/20* | (2006.01) |
| *G06F 1/16* | (2006.01) |
| *G06F 1/20* | (2006.01) |

(52) U.S. Cl.
CPC ....... *H05K 7/20409* (2013.01); *G06F 1/1681* (2013.01); *G06F 1/203* (2013.01)

(58) Field of Classification Search
CPC .. G06F 1/1681; G06F 1/203; G06F 2200/203; H05K 7/20409
See application file for complete search history.

(56) References Cited

U.S. PATENT DOCUMENTS

| | | | | |
|---|---|---|---|---|
| 5,383,340 | A * | 1/1995 | Larson | H01L 23/427 361/679.08 |
| 6,324,055 | B1 * | 11/2001 | Kawabe | G06F 1/1616 361/705 |
| 7,573,710 | B2 * | 8/2009 | Morino | H05K 5/0243 361/679.55 |
| 8,355,248 | B2 * | 1/2013 | Nishi | G06F 1/203 361/679.55 |
| 2006/0198101 | A1 * | 9/2006 | Cho | G06F 1/1624 361/679.55 |
| 2016/0135328 | A1 * | 5/2016 | Wu | G06F 1/203 361/679.03 |
| 2017/0017279 | A1 * | 1/2017 | Saeidi | G06F 1/203 |

(Continued)

*Primary Examiner* — Abhishek M Rathod
(74) *Attorney, Agent, or Firm* — Alliance IP, LLC

(57) ABSTRACT

A thermally conductive band can improve the flow of heat from a first portion of a mobile computing device (e.g., the base portion of a laptop computer) to a second portion of the mobile computing device (e.g., the lid portion of the laptop). The band is removably attachable to the mobile computing device via magnets or another attachment approach. The band comprises a thermally conductive layer, a first end removably attachable to an external surface of the first device portion, and a second end removably attachable to an external surface of the second device portion. The band can comprise thermal gap pads between the thermally conductive layer and the external surfaces to aid in providing a low thermal resistance path between the device and the band.

22 Claims, 14 Drawing Sheets

(56) References Cited

U.S. PATENT DOCUMENTS

2020/0233451 A1* 7/2020 Hong ................... G06F 1/1681
2020/0245501 A1* 7/2020 Wu ......................... F28F 3/02
2021/0185852 A1* 6/2021 Yang ................... H05K 7/2039

* cited by examiner

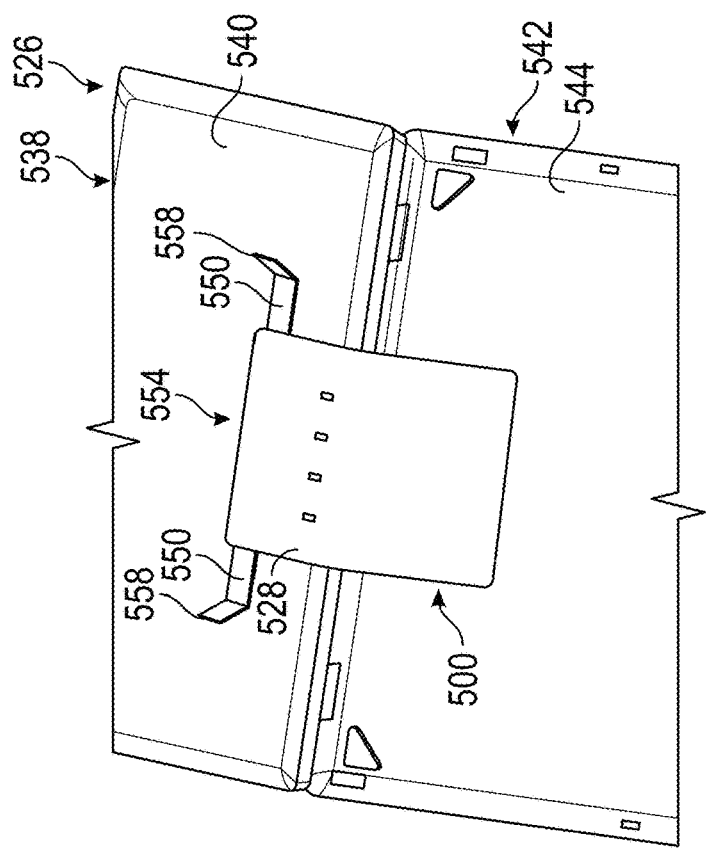
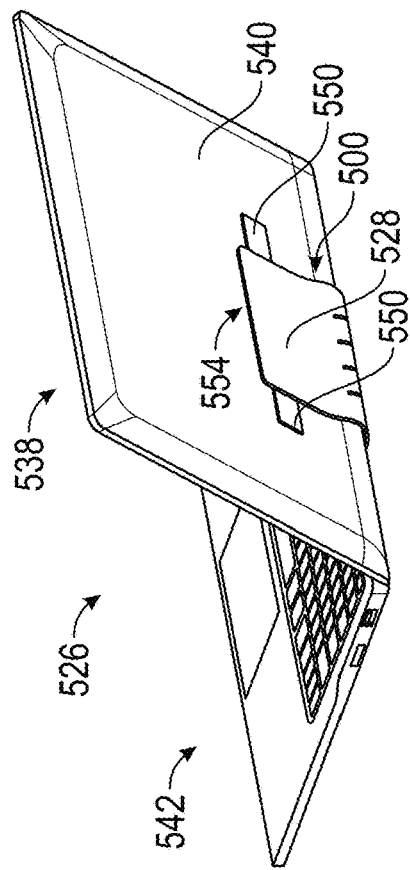
FIG. 5B
FIG. 5A

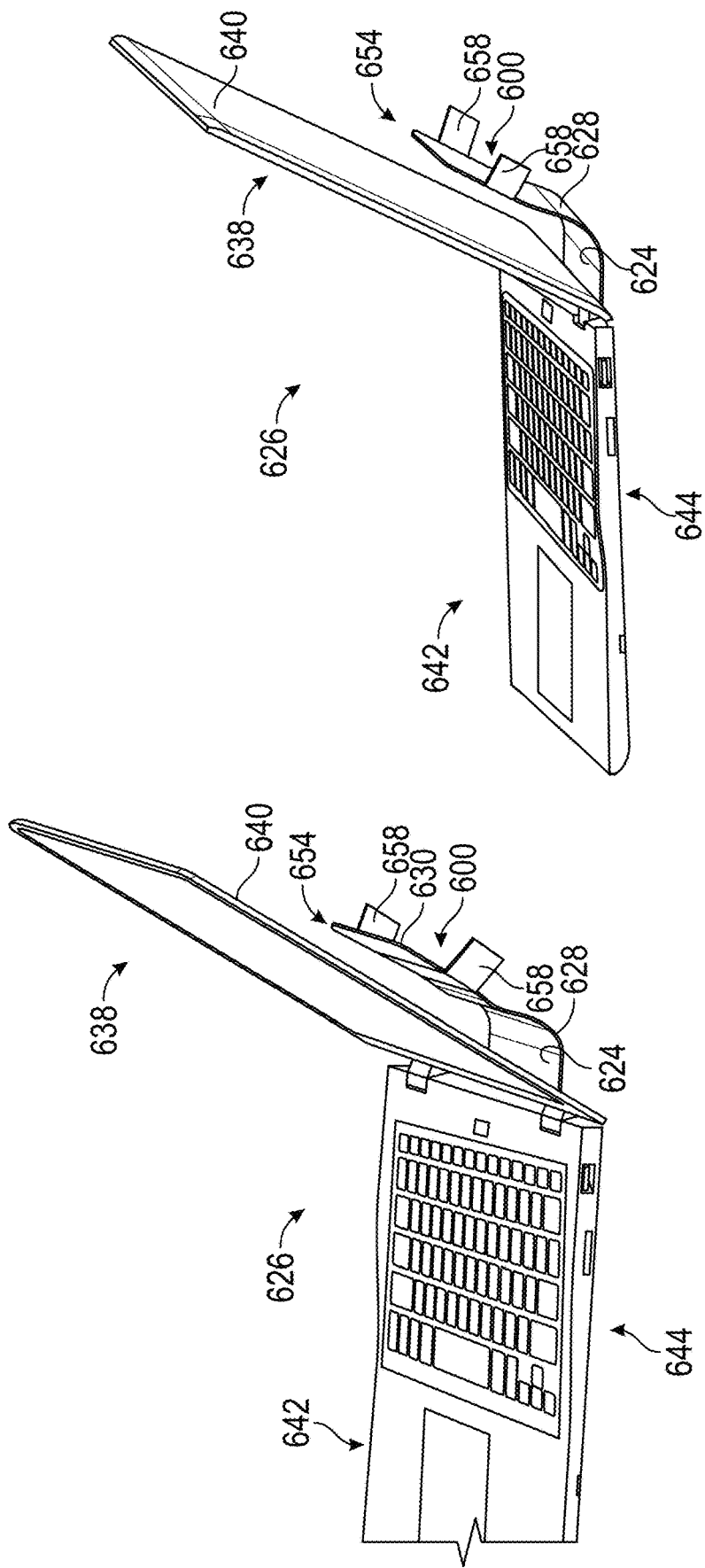

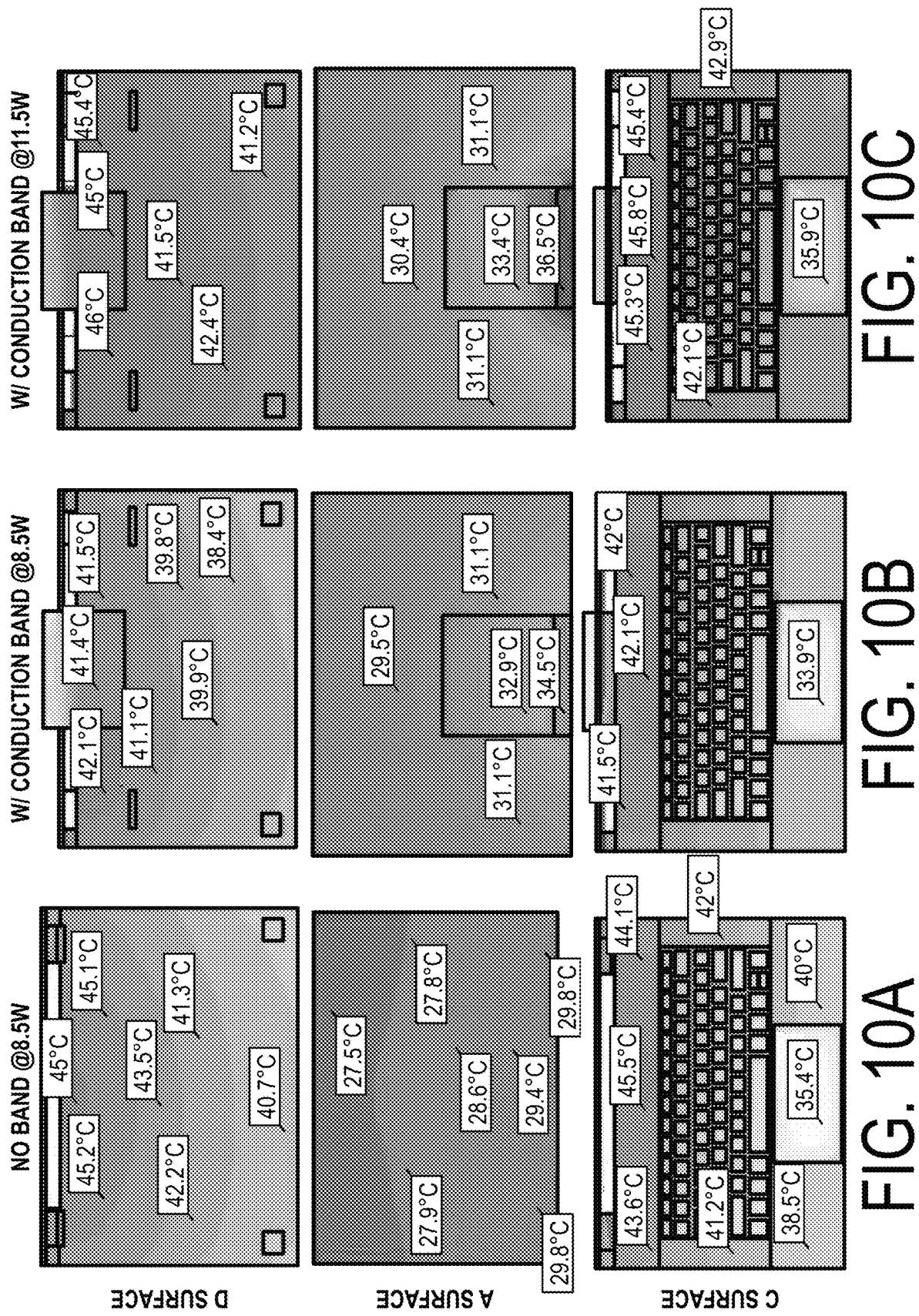

1200

DETECT THERMALLY CONDUCTIVE BAND ATTACHED TO MOBILE COMPUTING DEVICE
1204

INCREASE PERFORMANCE OF INTEGRATED CIRCUIT COMPONENT LOCATED IN MOBILE COMPUTING DEVICE
1208

FIG. 12

THERMAL CONDUCTION BAND FOR IMPROVED MOBILE COMPUTING DEVICE PERFORMANCE

CROSS-REFERENCE TO RELATED APPLICATION

This application claims the benefit of and priority from U.S. Provisional Patent Application No. 63/306,491, filed Feb. 3, 2022, and entitled THERMAL CONDUCTION BAND FOR IMPROVED MOBILE COMPUTING DEVICE PERFORMANCE. The disclosure of the prior application is considered part of and hereby incorporated by reference in its entirety in the disclosure of this application.

BACKGROUND

In thin and light laptop computers, processor power limits can be limited by skin temperature. The transfer of heat generated by integrated circuit components in the base portion of a laptop computer can be limited by the hinge and its design restrictions, which can impact laptop system cooling capacity.

BRIEF DESCRIPTION OF THE DRAWINGS

FIGS. 5A-5B illustrate perspective and bottom views, respectively, of an example thermal conduction band comprising extensions attached to a laptop.

FIGS. 6A-6B illustrate side perspective views of an example thermal conduction band attached to a laptop, the thermal conduction band configured to remove heat from the base of the laptop via convection.

FIGS. 10A-10C illustrate simulated thermal profiles of the A surface, C surface, and D surface of a laptop under operation with and without a thermal conduction band attached to the laptop.

FIG. 12 is an example method of adjusting mobile computing device performance based on detecting the presence of a thermal conduction band attached to the mobile computing device.

DETAILED DESCRIPTION

Figure 1:
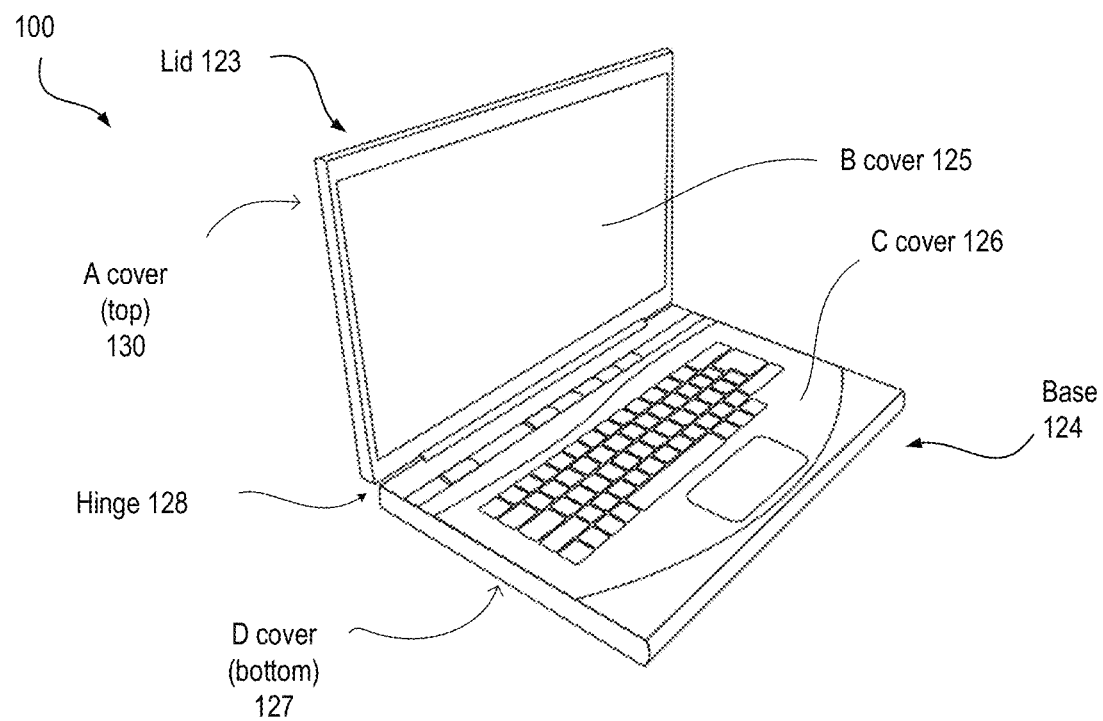
FIG. 1 is a perspective view of an example mobile computing device with which a thermal conduction band can be utilized.

In the current laptop computing design ecosystem, two factors that influence laptop design are the desire to build laptops that are the thinnest and lightest in their class and that have best-in-class performance. Laptop performance depends on TDP (thermal design power) limits. In laptops comprising an Intel® processor, the TDP of the processor can be represented by its PL1 and PL2 power levels. The PL1 power level is a maximum steady-state power level that the processor can draw and still be operating within its thermal limits and the PL2 power level is a short-term high-performance maximum power level (with PL2 being greater than PL1) that the processor can draw and still be operating within its thermal limits. The PL2 power level of an Intel® processor can be reached by operating the processor at higher "turbo frequencies" that are greater than the frequencies that the processor operates at while operating at the PL1 power level.

The TDP of laptop processors is limited by limits on the temperature that the exterior surfaces of the laptop are allowed to reach. As the thermal mass and heat removal capabilities of a laptop can be influenced by factors such as the laptop's industrial design, thickness, weight, and cost, these factors can influence the TDP of a laptop processor as well. As these factors are determined by OxMs (original brand manufacturers, original design manufacturers, original equipment manufacturers), the end user does not have the flexibility to extract more performance out of a laptop even if the user is willing to pay an additional cost, such as an additional accessory cost. Cooling docks are available for laptop computers that can allow for increased laptop performance by providing enhanced cooling of the laptop, but the selection of such cooling docks is limited and are typically not portable.

A typical laptop computer comprises two distinctive portions, a lid rotatably coupled to a base, with the base typically operating at a higher temperature due to the presence of more heat-generating components (e.g., integrated circuit components) in the base than in the lid. The hinge of a laptop and its design restrictions can limit the transfer of heat between the base and the lid, which can impact a laptop's cooling capacity.

Existing approaches to improve the removal of heat from a laptop base comprise cooling docks and cross-spreading. A cooling dock is an external accessory that may contain one or more fans that remove heat from the laptop through one or more ports of the cooling dock. In some cross-spreading heat removal approaches, a graphite spreader extends from the base to the lid to transfer heat from the base to the lid. The graphite spreader can pass through the laptop hinge, which can force specific hinge designs to be used (such as a barrel hinge) or be integrated into a cover that covers both lid and base portions. However, these existing cooling approaches can suffer from disadvantages. Cooling docks are typically not portable, consume additional power, and can be expensive. Integrating a graphite spreader into a laptop hinge may require a hinge redesign to accommodate the graphite spreader, which can present an engineering challenge due to industrial design restrictions. Integrating a graphite spreader into a cover can also cause an undesirable increase in the height of a laptop. Further, integrated graphite spreaders are not a laptop accessory, and as such, a potential laptop purchaser does not have the option to purchase a less expensive version of the laptop without the graphite spreader if the potential purchaser does not need the performance improvement provided by the graphite spreader.

Disclosed herein are thermal conduction bands that are removably attachable to a laptop computer and enhance the transfer of heat from the base of the laptop to the laptop lid. As such, they do not impact the industrial design or the existing thermal solution of a laptop. The enhanced transfer of heat from the base to the lid can improve the system performance of the laptop, regardless of workload or usage scenario. The thermal conduction band provides a channel (or bridge) for heat to flow from the D cover to the A cover of a laptop. That is, the thermal conduction bands thermally couple the base of a laptop to the lid of a laptop. In some embodiments, the thermal conduction band can provide cooling of the base via convective cooling. The thermal conduction band does not impact the functionalities of the laptop and can be a lower-cost cooling option relative to an external cooling dock. The disclosed thermal conduction bands have the further advantages of being an optional enhanced thermal management laptop solution-they do not need to be purchased or used if a user does not want to use them. Variations of the disclosed thermal conduction bands can be used with other mobile computing devices having a clamshell design, such as dual-display laptops, foldable tablets, and foldable smartphones. As discussed below, a wedge-shaped band can provide additional ergonomic benefits. Further, as the band can be a low-cost accessory, the band can be readily replaced if it suffers performance degradation due to excessive wear. Moreover, the disclosed thermal conduction bands are compact and portable.

As used herein, the phrase "thermally coupled" refers to components that are coupled to facilitate the transfer of heat.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements cooperate or interact with each other, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

FIG. 1 is a perspective view of an example mobile computing device with which a thermal conduction band can be utilized. The mobile computing device 100 can be a laptop or other mobile computing device having a similar form factor. The mobile computing device 100 comprises a lid 123, a base 124, and a hinge 128. The lid 123 comprises an "A" cover (surface, skin) 130 that is the top of the lid 123 when the mobile computing device 100 is in its closed position and a "B" cover (surface, skin) 125 that comprises a user-facing display when the lid 123 is open. The base 124 comprises a "C cover" (surface, skin) 126 that comprises a keyboard that is upward facing when the mobile computing device 100 is an open configuration and a "D cover" (surface, skin) 127 that is the bottom of the base 124. In some embodiments, the base 124 comprises the primary computing resources (e.g., CPU, GPU, SoC, or other integrated circuit components) of the mobile computing device 100, along with a battery, memory, and storage, and communicates with the lid 123 via wires that pass through a hinge 128. In some embodiments, the lid can comprise lid electronics, such as a lid controller hub that processes data provided by sensors located in the lid.

Figure 2:
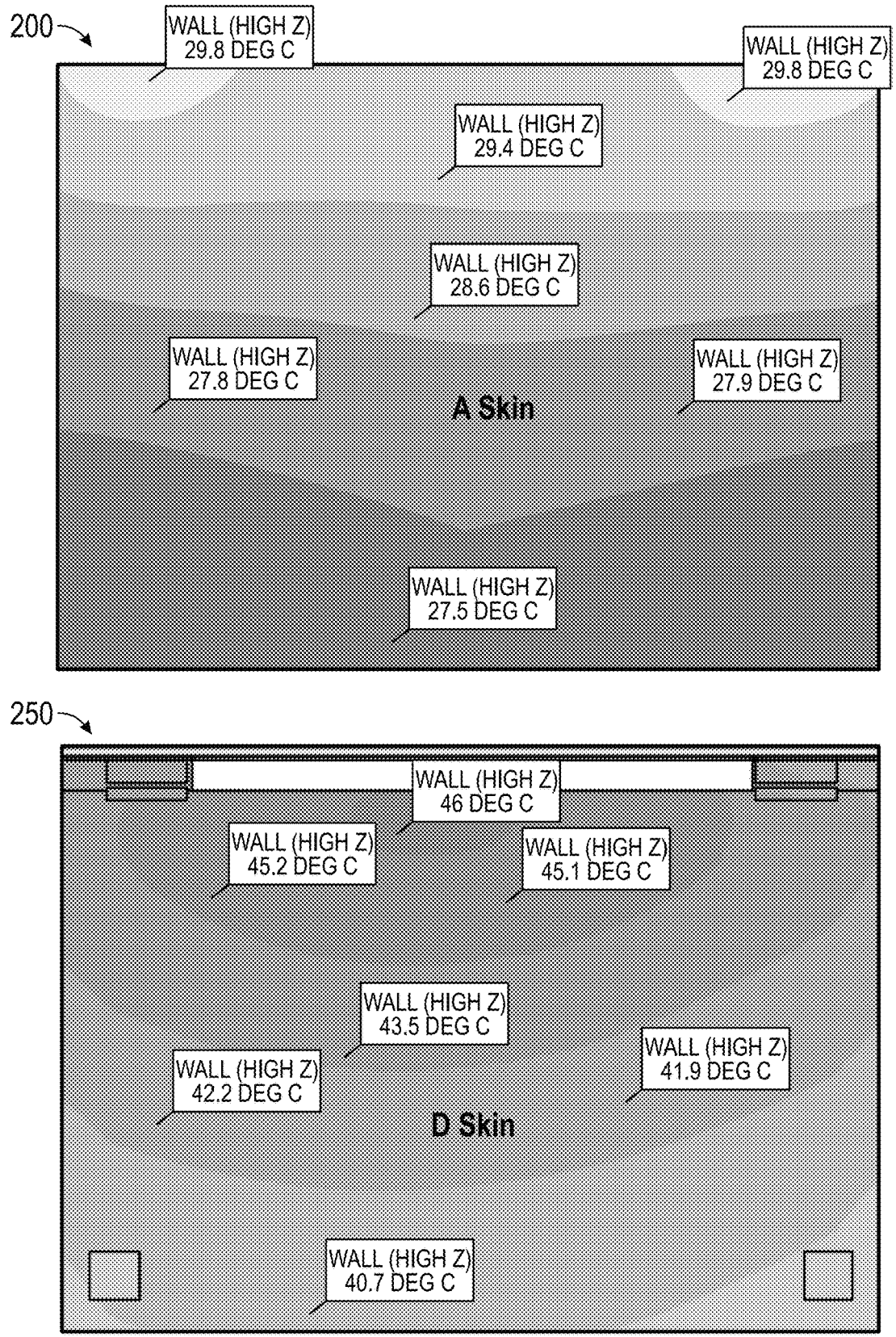
FIG. 2 illustrates example simulated temperature profiles for the A and D surfaces (skins) of an example laptop while the laptop is operating.

FIG. 2 illustrates example simulated temperature profiles for the A and D surfaces (skins) of an example laptop while the laptop is operating. The illustrated temperature profiles show that the skin temperatures of the lid are close to ambient temperatures, with temperature profile 200 showing temperatures of the A surface ranging from 27.5-29.8° C. The skin temperatures of the base are greater, with temperature profile 250 showing temperatures of the D surface ranging from 40.7-46.0° C. The A surface temperatures are low relative to the D surface temperatures due to the limited heat flow across the hinge from the base to the lid. The temperature profile 200 illustrated in FIG. 2 indicates that the A surface is unutilized for the transfer and removal of heat from the base.

Figure 3B:
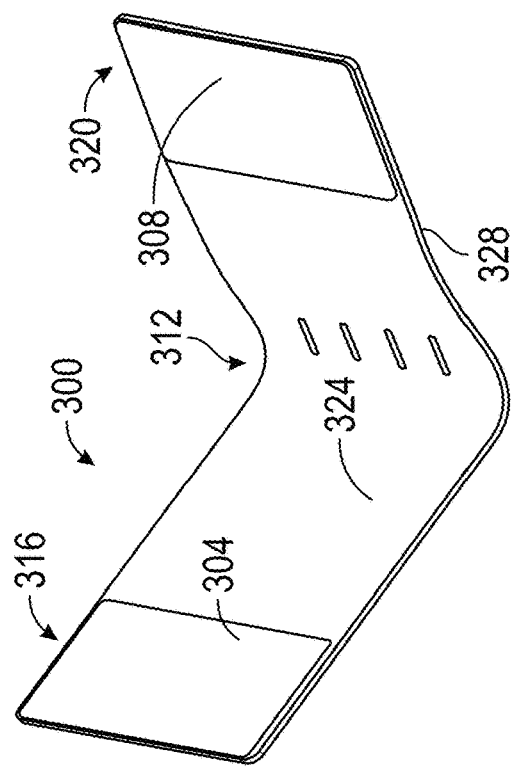
FIGS. 3A-3B illustrate an example thermal conduction band.
Figure 3A:
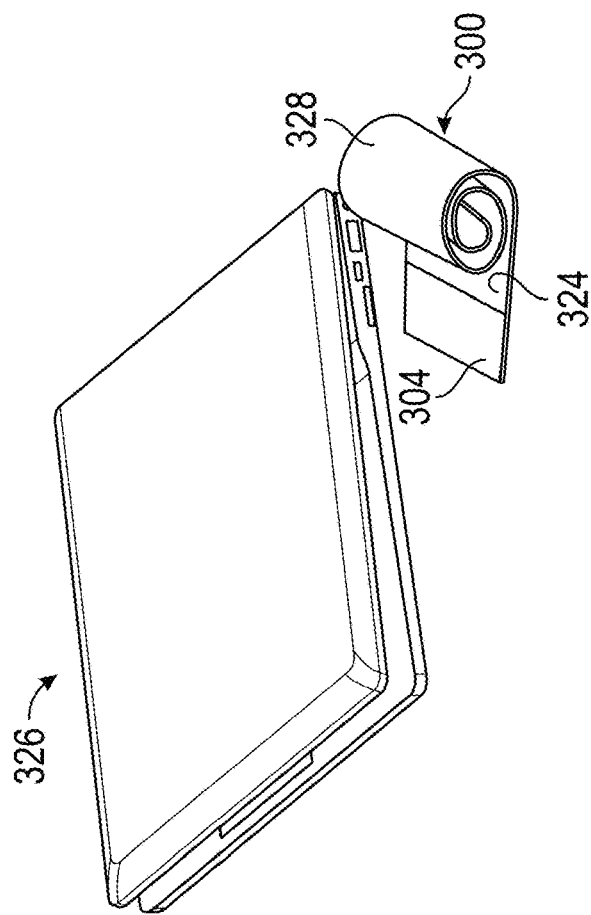

FIGS. 3A-3B illustrate an example thermal conduction band. The band 300 is a portable, detachable, and compact mobile computing device (e.g., laptop) accessory and acts as a thermal channel (or bridge) between the A and D surfaces of the device. The band 300 provides a channel for heat generated by components in the base to be transferred to the lid. By increasing the heat removal capacity of the system, the band 300 allows the TDP of the laptop processor (e.g., PL1 and PL2 levels of some Intel® processors) to be increased, without altering skin temperature limits, thus boosting the overall system performance of the laptop.

The band 300 comprises a first thermal gap pad 304, a second thermal gap pad 308, and a thermally conductive layer 312. FIG. 3A illustrates the band 300 separated from a laptop 326 and in a rolled-up configuration. FIG. 3B illustrates the band 300 in an unrolled configuration (demonstrating its compactness). The first and second thermal gap pads 304 and 308 are positioned at a first end 316 and a second end 320, respectively, of the thermally conductive layer 312 and on an interior surface 324 of the band 300. The interior surface 324 faces a mobile computing device (e.g., laptop 326) when the band 300 is attached to the mobile computing device, and an exterior surface 328 of the band faces away from the mobile computing device when the band 300 is attached to the mobile computing device.

Figure 4A:
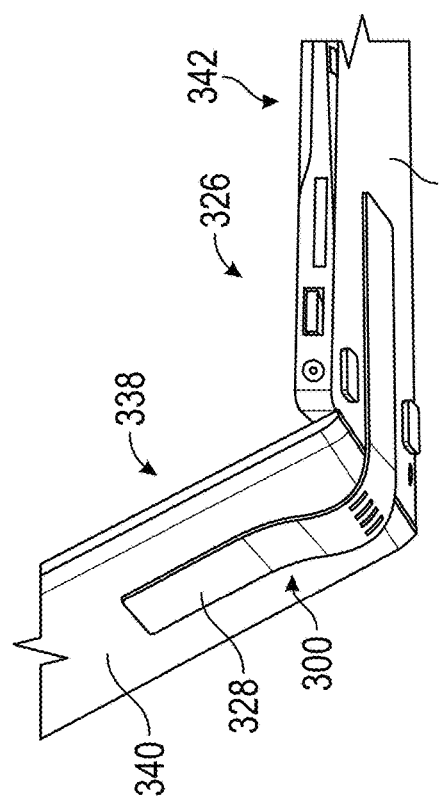
FIGS. 4A-4C illustrate the example thermal conduction band of FIGS. 3A-3B attached to an example laptop.
Figure 4B:
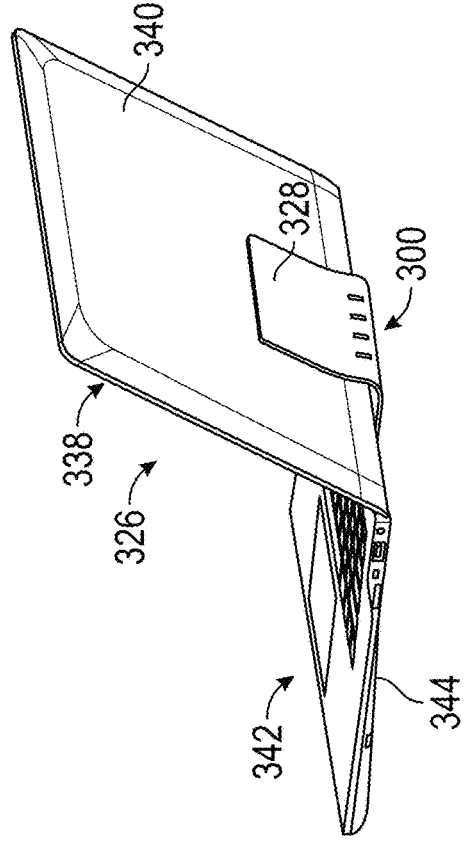
Figure 4C:
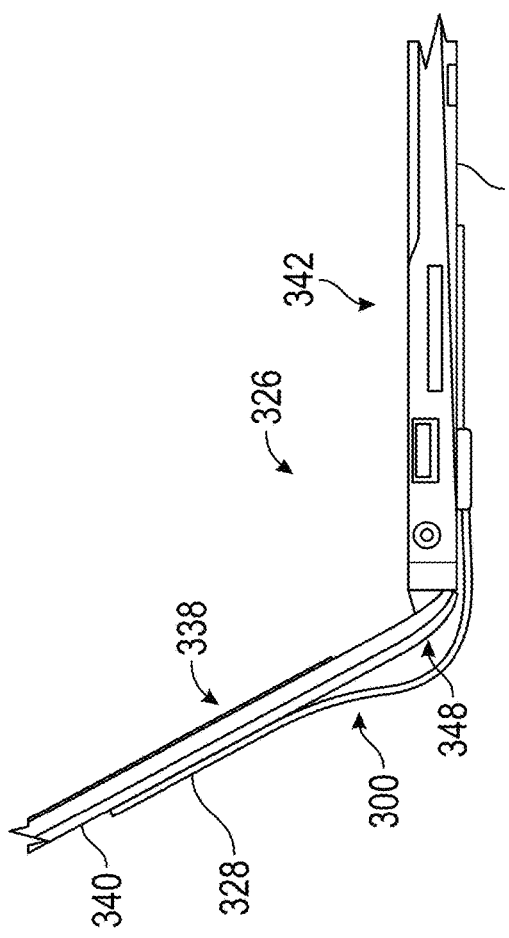

FIGS. 4A-4C illustrate the example thermal conduction band 300 of FIGS. 3A-3B attached to an example laptop. FIGS. 4A and 4B illustrate perspective views of a laptop 326 with an attached band 300 and FIG. 4C illustrates a side view of the band-laptop system. The laptop 326 comprises a lid 338 (a first portion of the laptop 326) and a base 342 (a second portion of the laptop 326), the lid 338 comprising an A surface 340 and the base 342 comprising a D surface 344. The A surface 340 is a part of an A cover, the D surface 344 is part of a D cover, and the A and D covers comprise thermally conductive materials. The band 300 attaches to the A surface 340 of the laptop 326 at the first thermal gap pad 304 and to the D surface 344 at the second thermal gap pad 308.

In some embodiments, the band 300 is flexible to accommodate the lid 338 being adjustable to be oriented at various angles relative to the base 342. Thus, in some orientations of a laptop in an open configuration with a thermal conduction band attached to the laptop, there can be a gap between the band and the laptop along a portion of a length of the band, such as a gap 348 located between the band 300 and the laptop 326. In some embodiments, such as indicated in FIG. 3A, a thermally conductive band can be rollable.

In some embodiments, a band can have a wedge, bump, or other suitable feature that raises the base of the laptop when the band is attached to the laptop, which can provide ergonomic benefits to a user. For example, the end of a band that attaches to the base of a laptop can have a wedge-shaped or other cross-sectional profile that causes an end of the laptop base to be lifted up from a surface upon which the mobile computing is placed.

FIGS. 5A-5B illustrate perspective and bottom views, respectively, of an example thermal conduction band comprising extensions attached to a laptop. The band 500 is attached to an A surface 540 of a lid 538 of a laptop 526 and a D surface 544 of a base 542 of the laptop 526. The band 500 comprises an exterior face 528 and extensions 550 that extend from an end 554 of the band 500 and that are in contact with or are near the A surface 540. The extensions 550 comprise one or more thermally conductive materials to provide for the transfer of heat from the base 542 to a greater amount of surface area of the A surface than provided by the band 500 excluding the extensions 550. By providing additional heat removal capacity from the base of a laptop, extensions to a thermal conduction band can increase the thermal budget of the laptop processor as compared to an embodiment in which the thermal conduction band does not comprise extensions.

In some embodiments, the extensions 550 are flexible and/or rollable and a user can bend the ends of the extensions 550 away from the external surface 540 of the lid 538 to create tabs 558 (illustrated in FIG. 5B, but not FIG. 5A) when the laptop is operating. That is, the extension is foldable to allow the extension to be moved from a first orientation to a second orientation, the extension in the first orientation extending in a direction further away from the mobile computing device than when the extension is in the second orientation. Tabs 558 allow for heat transferred from the band 500 by the extensions 550 to transfer to the ambient air surrounding the laptop 526. When the user is done using the laptop, the user can bend the tabs 558 back toward the A surface of the laptop so that the laptop or the band (when separated from the laptop after a work session) can be more easily stowed.

FIGS. 5A and 5B show two extensions extending in opposite directions away from a longitudinal axis of the band 500. In other embodiments, the band 500 can comprise one or more than two extensions 550 and the extensions can be arranged about the band 500 in any configuration and the individual extensions can extend from the band 500 in any direction.

FIGS. 6A-6B illustrate side perspective views of an example thermal conduction band attached to a laptop, the thermal conduction band configured to remove heat from the base of the laptop via convection. The band 600 comprises an interior face 624, an exterior face 628, a thermal gap pad 630, and tabs (or extensions) that extend from an end 654 of the band 600. At an end (not shown) of the band 600 opposite from the end 654, the band 600 is attached to a D surface 644 of a base 642 of a laptop 626. The portion of the band 600 not attached to the base 642 or positioned adjacent to the base 642 extends into a region of the environment located adjacent to an A surface 640 of a lid 638 of the laptop 626. The band 600 thus removes heat from the base 642 by the transfer of heat along the band 600 from the base to the end 654 and dissipating the transferred heat into the environment surrounding the end 654 of the band 600. The air heated by the heat transferred from the base is removed from the environment immediately surrounding the A surface 640 by convection. In other embodiments, the band 600 comprises one or more than two tabs 658 and the tabs 658 can be arranged about the end 654 of the band 600 in any configuration and the individual tabs 658 can extend from the band 600 in any direction. In some embodiments, the band 600 does not comprise tabs 658.

In some embodiments, a thermal conduction band can have a different aspect ratio than illustrated in FIGS. 3A-3B, 4A-4C, 5A-5B, and 6A-6B. That is, a thermal conduction band can be longer, shorter, wider, or thinner than illustrated to achieve desired thermal benefits. For example, a thermal conduction band intended for use with a high-performance laptop may be wider and/or longer than a thermal conduction band intended for use with a lower-performance laptop. Further, in some embodiments, thermal conduction band can comprise a cutout to accommodate an intake vent or exhaust vent of the mobile computing device such that the thermal conduction band does not block the vent when the thermal conduction band is attached to the mobile computing device. Moreover, and as mentioned above, the thermal conduction bands disclosed herein can be utilized with mobile computing devices of various types, shapes, and form factors and comprising a first portion rotatably attached via a hinge to a second portion, such as laptops, foldable tables, and foldable smartphones. The disclosed bands can further be used with mobile computing devices that already comprise an active (e.g., fans) or passive (e.g., heat pipe, heat sink, heat spreader passing through a hinge) cooling solution.

Figure 7:
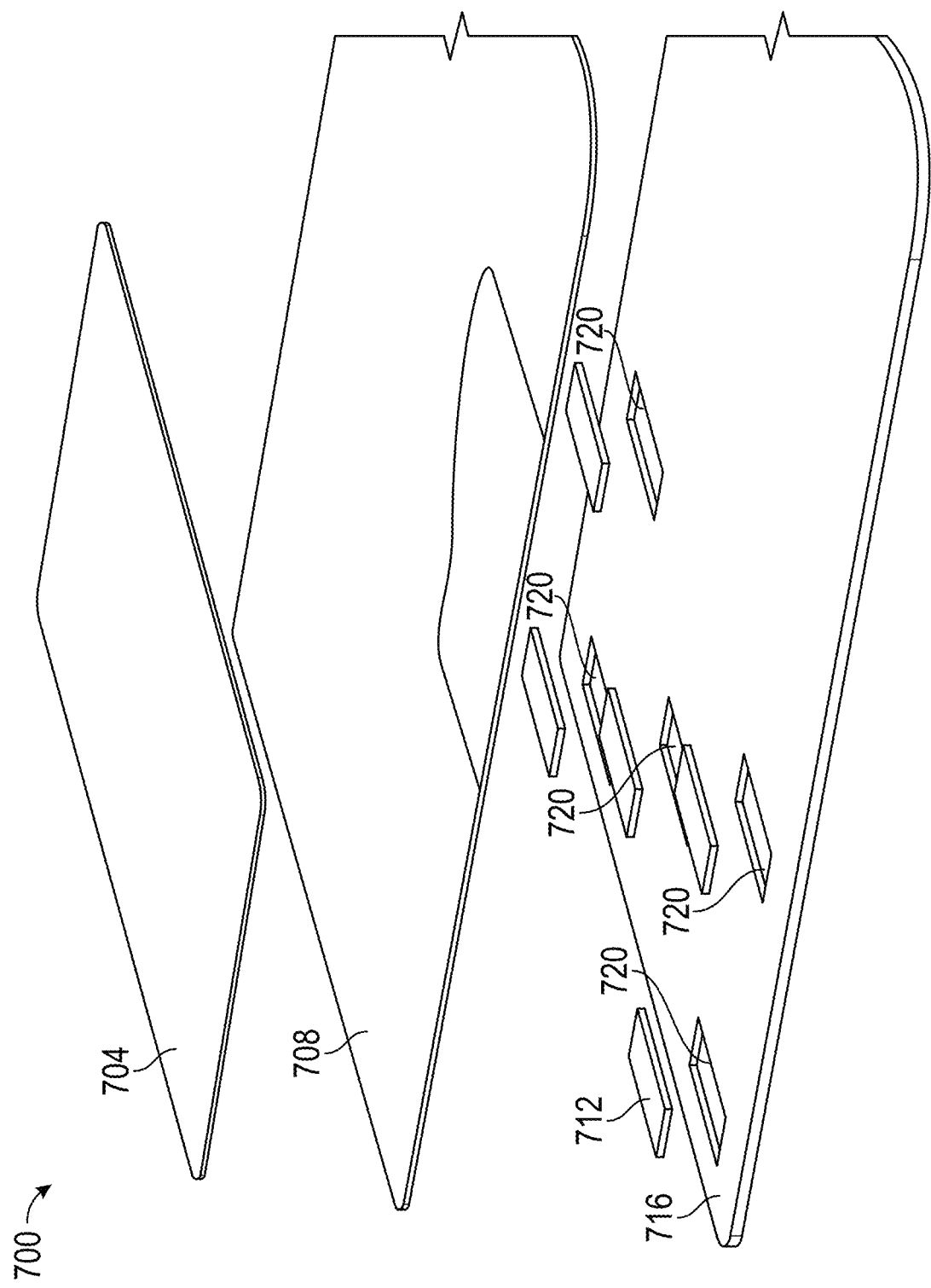
FIG. 7 illustrates an exploded view of a portion of an example thermal conduction band.

FIG. 7 illustrates an exploded view of a portion of an example thermal conduction band. The band 700 comprises a thermal gap pad 704, a thermally conductive layer 708, an outer layer 716, and a plurality of magnets 712 located in a plurality of recesses 720 located in the outer layer 716. The thermal gap pad 704 comprises a thermally conductive material that provides for low thermal resistance between the conductive layer 708 and an outer surface (e.g., A surface, D surface) of a laptop, even in the presence of surface irregularities on a laptop surface. In some embodiments, the thermal gap pad can be a conformal material that conforms to surface irregularities on a mobile computing device surface. In some embodiments, the thermal gap pad comprises silicone rubber or a silicone gel. In other embodiments, another suitable thermal interface material (TIM) could be used in place of the thermal gap pads. The thermal gap pad 704 can be attached to the conductive layer 708 with or without an adhesive. In some embodiments, the thermal gap pad 704 can be replaceable.

The thermally conductive layer 708 can comprise aluminum (e.g., aluminum foil), another metal, or another suitable conductive material. The outer layer 716 can comprise a fabric or another suitable material that provides a pleasant aesthetic. The magnets 712 allow the band 700 to attach to a laptop through magnetic attraction to a ferrous strip or structure integrated within the laptop, as will be discussed below. Although five magnets 712 are shown in FIG. 7, in other embodiments, the band 700 can comprise fewer or more magnets. In some embodiments, the magnets 712 can be in recesses located in the conductive layer 708 or be attached to the conductive layer 708. In some embodiments, the band 700 does not comprise an outer layer 716, and the exterior-facing surface of the band 700 when attached to a laptop is a surface of the conductive layer 708. In some embodiments, a thermal conduction band does not comprise a thermal gap pad and the flow of heat between the laptop surfaces and the band relies upon direct contact between the band and a laptop surface. In some embodiments, the thermal conduction band 700 is thinner than the height of the "feet" of a mobile computing device to which it can be attached such that the band does not interfere with the feet of the mobile computing device from providing a stable platform for the mobile computing device.

Figure 8:
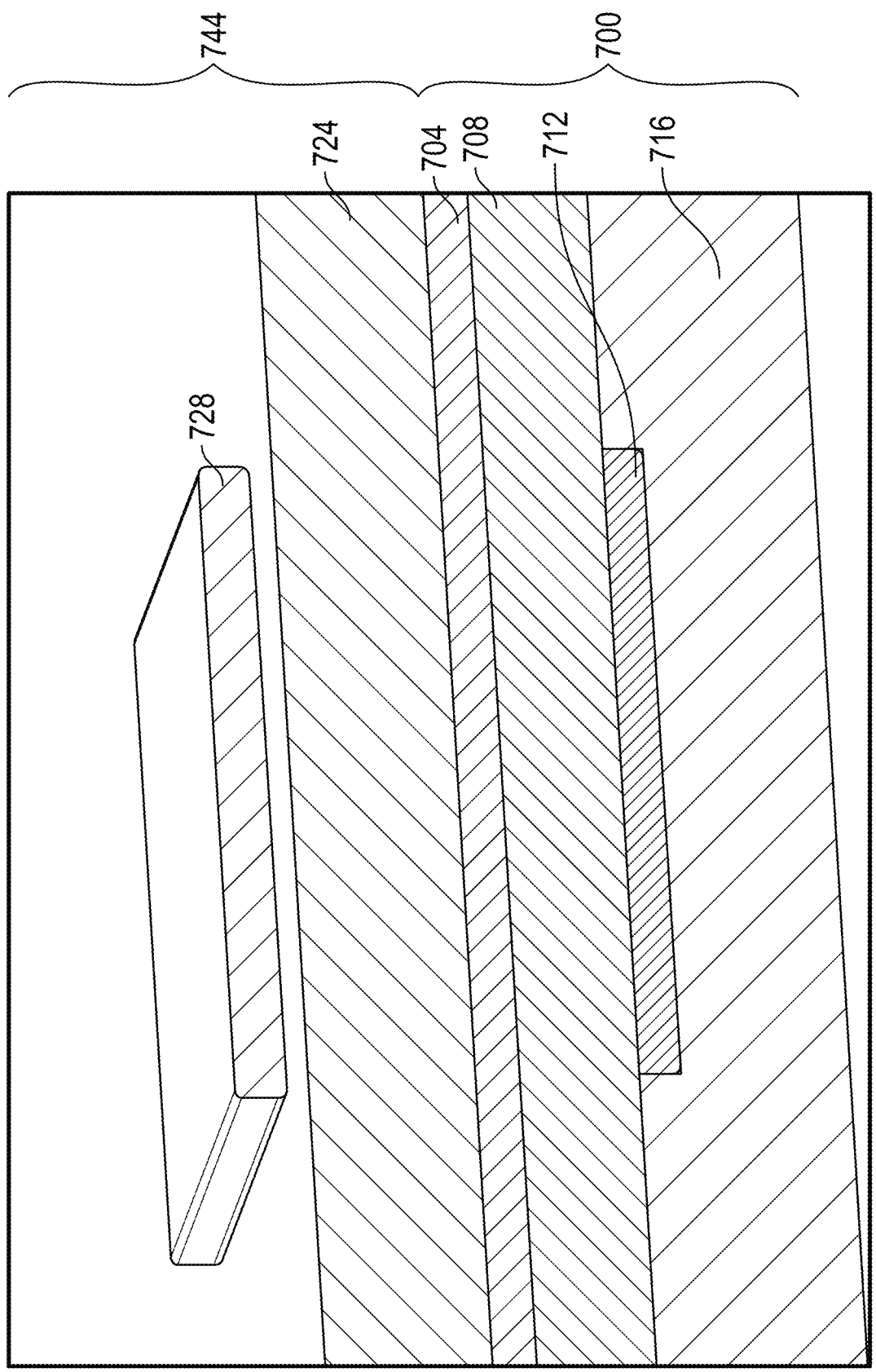
FIG. 8 illustrates a cross-section of the example thermal conduction band of FIG. 7 attached to a D surface of a laptop.

FIG. 8 illustrates a cross-section of the example thermal conduction band of FIG. 7 attached to a D surface of a laptop. The band 700 attaches to a D surface 724 of a base 744 of a laptop through the attraction of the magnet 712 to a ferrous strip 728 integrated into the base 744. Heat is transported from the base 744 to the band 700 by flowing from the D surface 724 (which comprises a thermally conductive material), through the thermal gap pad 704, and to the conductive layer 708. The heat then is transferred along the conductive layer 708 to another thermal gap pad (not shown) in contact with the A surface of the laptop. In some embodiments, the ferrous strips or structures (e.g., pads, tabs) in the lid and base comprise iron-steel strips.

Figure 9:
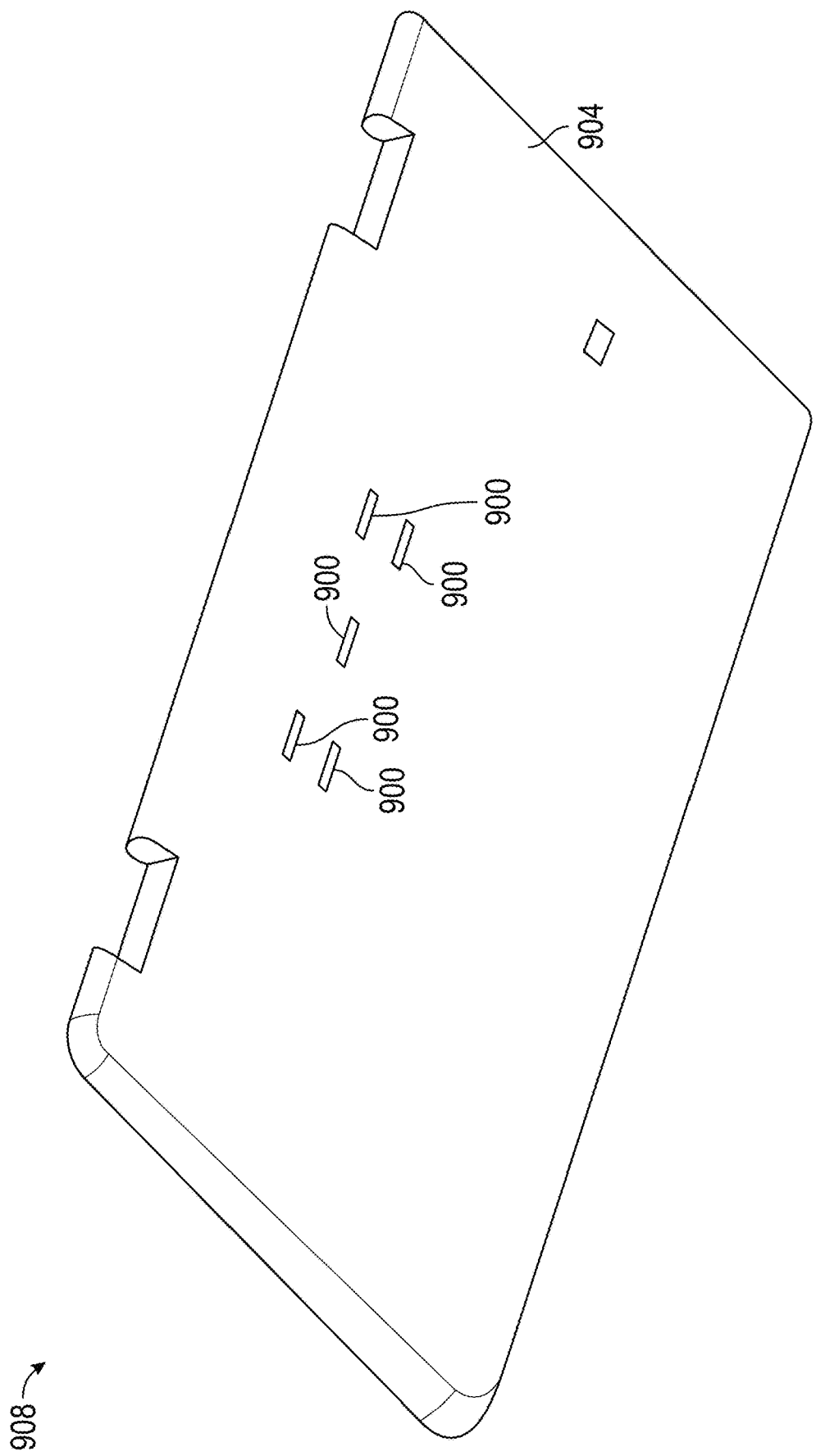
FIG. 9 illustrates an example arrangement of ferrous strips integrated into a laptop surface to enable the attachment of a thermal conduction band to the laptop.

FIG. 9 illustrates an example arrangement of ferrous strips or structures integrated into a laptop surface to enable the attachment of a thermal conduction band to the laptop. Five ferrous strips 900 are arranged on an interior surface 904 of the A cover or D cover of a laptop 908 in a configuration that is complementary to an arrangement of magnets in a thermal conduction band. In other embodiments, the magnets can be located on the interior surface of a cover of a first portion of a mobile computing device or a second portion of a mobile computing device, the first portion connected to the second portion by a hinge.

In some embodiments, a band can comprise a thermal gap pad having a thickness of about 0.3 mm, a thermally conductive layer comprising aluminum and having a thickness of about 0.3 mm, and an outer layer comprising a fabric and having a thickness of about 0.3 mm. The band can have a length of about 175 mm and a width of about 100 mm. In other embodiments, a thermal conduction band can have other thermal gap pad, outer layer, and conductive layer thicknesses, and overall band lengths and widths.

In some embodiments, the magnets in the thermal conduction bands described herein can be N52 grade neodymium magnets. In some embodiments, a band can comprise five N52 neodymium magnets to connect to an A surface or D surface, with individual magnets having dimensions of 33 mm (width)×6 mm (length)×0.8 mm (thickness). An appropriately sized ferrous strip or structure can be integrated into the A surface to D surface to attract the five-magnet set. In some embodiments, a force of about 5-7 lbs. is applied to the thermal gap pad when a band is attached to a laptop. In other embodiments, other amounts of force can be applied to a thermal gap pad when a band is attached to a laptop.

In some embodiments, approaches other than magnetic attraction can be used to attach a thermal conduction band to a laptop, such as spring-based connectors or hook and loop fasteners. In some embodiments, a laptop can comprise a sliding mechanism to lock the thermal conduction band in place. In other embodiments, the thermal conduction band can comprise hooks that enter slots on one of the portions of a mobile computing device. In still other embodiments, the thermal conduction band attaches to one or more surfaces of a mobile computing device in a non-removable manner via an adhesive. For example, a user can purchase a thermal conduction band with an adhesive backing as an accessory after purchasing a mobile computing device, peel a backing off from the thermal conduction band that exposes an adhesive portion of the thermal conduction band, and attach the thermal conduction band to a surface of the mobile computing device. A thermal conduction band can have one or more adhesive portions that can be attached to one or more surfaces of a mobile computing device. Any of the approaches listed herein for attached a thermal conduction band to a mobile computing device can be used on the end of the thermal conduction band that attaches to the A surface and/or on the end of the thermal conduction band that attaches to the D surface. The attachment approaches can be mixed and matched. For example a thermal conduction band can attach to an A surface via magnets and a D surface via a hook and loop fastener.

FIGS. 10A-10C illustrate simulated thermal profiles of the A surface, C surface, and D surface of a laptop under operation with and without a thermal conduction band attached to the laptop. FIG. 10A illustrates the thermal profiles of the A, C, and D surfaces of a laptop operating at 8.5 W without a thermal conduction band attached to the laptop and FIGS. 10B and 10C illustrate thermal profiles of the A, C, and D surfaces with a thermal conduction band attached to the laptop when the laptop is operating at 8.5 W and 11.5 W, respectively.

The thermal simulations were performed under the following conditions. The laptop had a clamshell design and was passively cooled, with the CPU (central processing unit) and its thermal solution facing the D surface of the laptop. The ambient temperature was 25° C.; the laptop surface (skin) temperature limit was 46° C.; the baseline CPU power limit was 8.5 W; the A and D surfaces were made of aluminum; and the thermal conduction band had dimensions of 100 mm (width)×175 mm (length)×0.3 mm (height) with a conductive layer comprising aluminum, a fabric outer layer having a thickness of 0.3 mm, and thermal gap pads having a thickness of 0.2 mm.

The thermal simulation results indicate that with the use of a thermal conduction band, the temperatures of the C and D surfaces can be maintained below the surface temperature limit of 46° C., even with the laptop processor operating at a power level of 11.5 W, three watts above the processor's baseline power limit of 8.5 W. Thus, the thermal simulation results indicate that the thermal conduction bands disclosed herein aid in transferring heat from the base to the lid of a laptop and allow the processor to operate at a higher power level while keeping the temperature of the laptop surfaces within surface temperature limits. The thermal simulations indicate that a TDP improvement of about 35% (a CPU PL1 level increase from 8.5 W to 11.5 W) can be achieved using the thermal conduction bands disclosed herein. Simulation results of a second laptop design indicate a TDP improvement of about 20% and a processor performance improvement of about 35% using a thermal conduction band.

Table 1 summarizes various simulated temperatures for the three operational scenarios illustrated in FIGS. 10A-10C. CPU Tj is the junction temperature of the laptop CPU; PCH Tj is the junction temperature of an Intel® Platform Controller Hub (PCH) included in the simulated laptop; and A skin, C skin, and D skin are representative temperatures of the A, C, and D surfaces of the laptop.

TABLE 1

| Case | CPU power | CPU $T_j$ | PCH $T_j$ | D skin | A skin | C skin |
|---|---|---|---|---|---|---|
| w/o conduction band | 8.5 | 71.1 | 61.6 | 46 | 29.8 | 45.9 |
| w/conduction band | 8.5 | 67.8 | 58.3 | 42.1 | 34.9 | 42.1 |
| | 11.5 | 72.2 | 67.8 | 46 | 36.8 | 45.8 |

Thermal simulations of a thermal conduction band with no thermal gap pad (a 0.1 mm air gap+0.35 mm conductive layer thickness+0.35 leather outer layer) indicate that such a band configuration can also improve the performance of a mobile computing device, with the simulation results indicating that the TDP of the laptop processor can be increased by about 25%.

Table 2 summarizes actual temperatures at various locations on the external surfaces of an example laptop with a thermal conduction band attached to the laptop. Table 2 summarizes the actual temperatures with and without attachment of a thermal conduction band at locations on the D cover in the proximity of a CPU, heat pipe, and heat exchanger of the laptop, and at a location near the center of the A cover. At a cover temperature limit of 48° C., the CPU was able to run at 23.6 W with the thermal conduction band present.

TABLE 2

| Temperature | Without conduction band | With conduction band |
|---|---|---|
| D cover - CPU | 48.2° C. | 43° C. |
| D cover - heat pipe | 47.5° C. | 42.3° C. |
| D cover - heat exchanger | 46.7° C. | 42.6° C. |
| A cover | 28.7° C. | 33.8° C. |
| CPU TDP (scaled to 48° C. cover limit) | 20 W | 23.6 W |

Figure 11A:
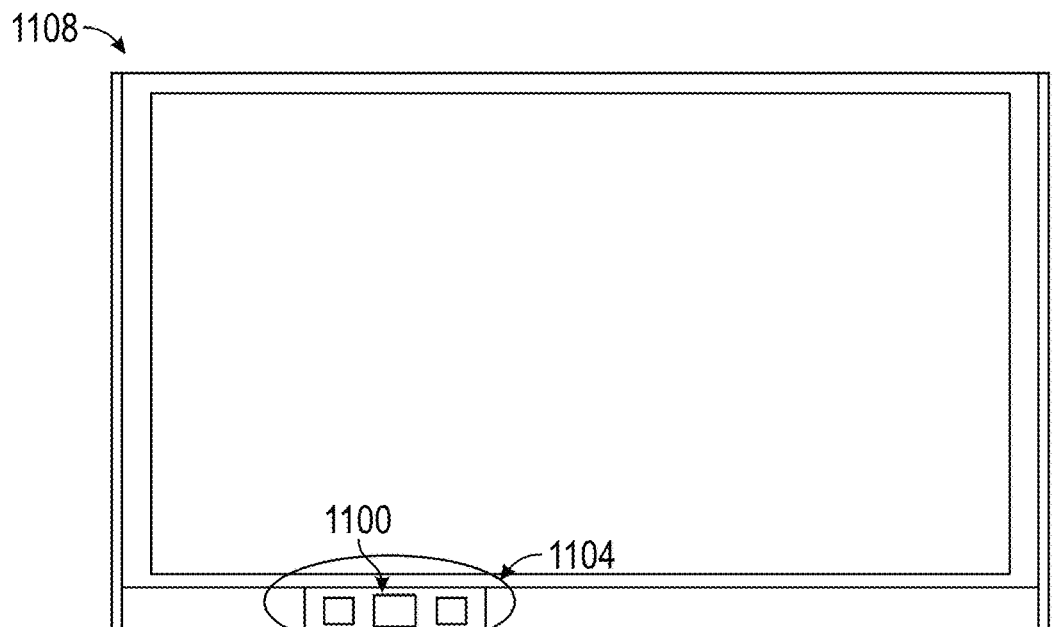
FIGS. 11A-11C illustrate the simulated impact of using a thermal conduction band on the temperature experienced by electronics located in the lid.
Figure 11B:
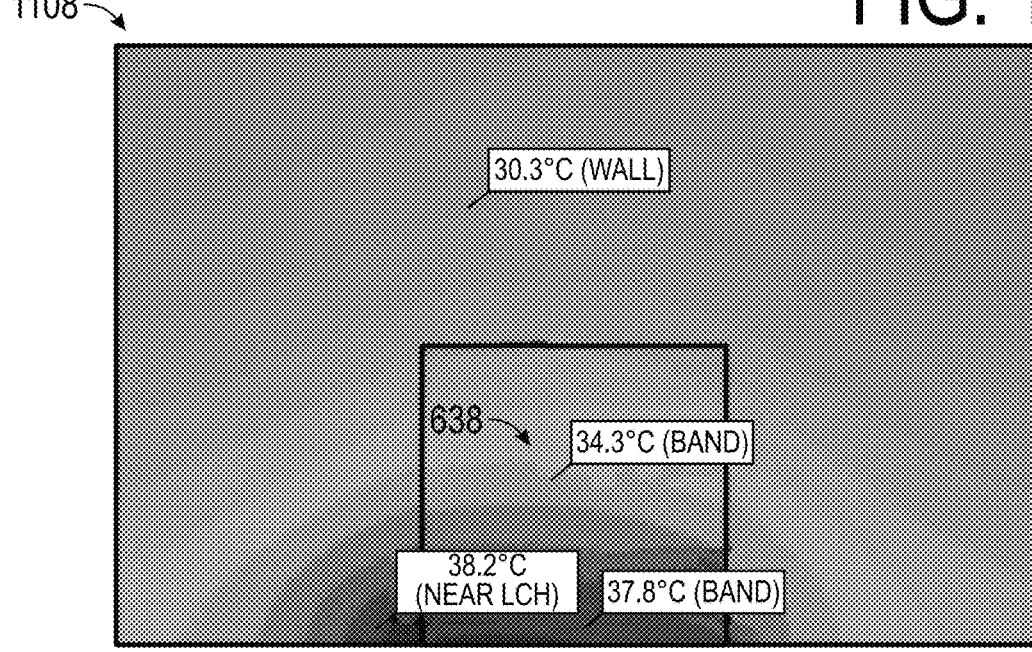
Figure 11C:
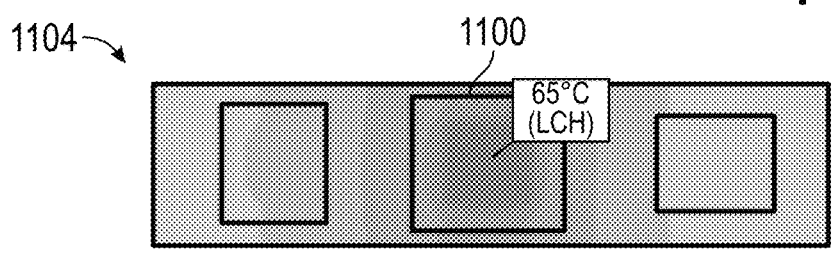

FIGS. 11A-10C illustrate the simulated impact of using a thermal conduction band on the temperature experienced by electronics located in the lid. FIG. 11A illustrates the location of lid electronics 1100 and a lid electronics assembly 1104 as seen through an A surface 1108 of a lid of a laptop. In some embodiments, the lid electronics 1100 can comprise one or more processing units that process sensor data generated by input sensors located in the lid of a laptop, such as microphones, cameras, and a touchscreen. FIGS. 11B and 11C illustrate simulated thermal profiles of the A surface 1108 of a laptop and the lid electronics 1100 and lid electronics assembly 1104 with the lid electronics 1100 operating at 0.9 W and the lid electronics assembly operating at 1.0 W and with a conduction band attached to the laptop. Without the conduction band (thermal simulation results not shown), the temperature (Tj) of the lid electronics is about 61.8° C. With the conduction band and under the conditions described above associated with FIGS. 11B and 11C, Tj of the lid electronics 1100 is about 65.4° C., an increase of 3.6° C., which is well within the operating specifications of the lid electronics 1100 and other lid components.

The thermal conduction bands can be utilized with mobile computing devices having a clamshell configuration and can work with mobile computing devices having passive or active cooling solutions. The bands can be designed or placed to work with mobile computing devices comprising cooling fans to keep fan exhausts (vents) unblocked.

In some embodiments, a laptop or other mobile computing device can comprise one or more sensors that can be utilized to indicate a thermal conduction band attached to the laptop and the laptop can increase the power consumption of a processor unit or other integrated circuit component located in the mobile computing device in response to detecting a thermal conduction band attached to the mobile computing device. The laptop or mobile computing device can reduce the power consumption of the processor unit or other integrated circuit component in response to detecting detachment of a thermal conduction band while the mobile computing device is operating at an increased power consumption level due to the presence of the thermal conduction band attached to the mobile computing device. The mobile computing device can utilize sensor data provided by the one or more sensors (e.g., capacitive, photoelectric, inductive, magnetic, or ultrasonic proximity sensors) integrated into the mobile computing device to determine the presence or absence of a thermal conduction band attached to the mobile computing device. These sensors can be located in any portion of a mobile device (e.g., lid or base of a laptop). The power consumption of an integrated circuit component can be increased or decreased by, for example, increasing or decreasing, respectively, the power supply voltage or operational frequency of the integrated circuit component.

Increasing or decreasing the performance of an integrated circuit component based on detecting the presence or absence of a thermal conduction band attached to the mobile computing device can cause the integrated circuit component to transition to a higher or lower power consumption state faster than if power consumption state transitions are based on temperature sensor data of the integrated circuit component or platform. For example, consider a CPU or platform controller that can adjust the power consumption level of a CPU based on temperature sensor data provided by temperature sensors located in the CPU or elsewhere on a platform. Adding a thermal conduction band to the laptop while the CPU is running at its TDP level (which can be determined based on the temperature of the CPU, as indicated by the temperature sensor data, being at or above a maximum temperature) will cause the temperature of the CPU to decrease (due to the increased cooling capacity of the laptop) and the CPU or platform controller will cause the power consumption level of the CPU to increase until the temperature sensor data indicates that the CPU is operating at the maximum temperature. Detecting the presence or absence of a thermal conduction band attached to a mobile computing device can occur faster than the time it takes for the temperature of an integrated circuit component to fall or rise due to the attaching or detaching of a thermal conduction band to the mobile computing device.

The thermal conduction bands described herein can be utilized with any of a variety of computing systems, including mobile computing systems, such as smartphones, handheld computers, tablet computers, laptop computers, portable gaming consoles, 2-in-1 convertible computers, and portable all-in-one computers. As used herein, the term "computing devices" includes computing systems.

FIG. 12 is an example method of adjusting mobile computing device performance based on detecting the presence of a thermal conduction band attached to the mobile computing device. The method 1200 can be performed by, for example, a laptop computer. At 1204, a mobile computing device detects a thermally conductive band attached to the mobile computing device, the detecting the thermal conduction band attached to the mobile computing device based on sensor data provided by one or more sensors integrated into the mobile computing device. At 1208, the mobile computing device increases a power consumption of an integrated circuit component located in the mobile computing device in response to detecting attachment of the thermally conductive band to the mobile computing device.

In other embodiments, the method 1200 can comprise one or more additional elements. For example, in some embodiments, the method 1200 further comprises detecting, by the mobile computing device, detachment of the thermally conductive band from the mobile computing device and decreasing the power consumption of the integrated circuit component in response to detecting detachment of the thermally conductive band from the mobile computing device.

Figure 13:
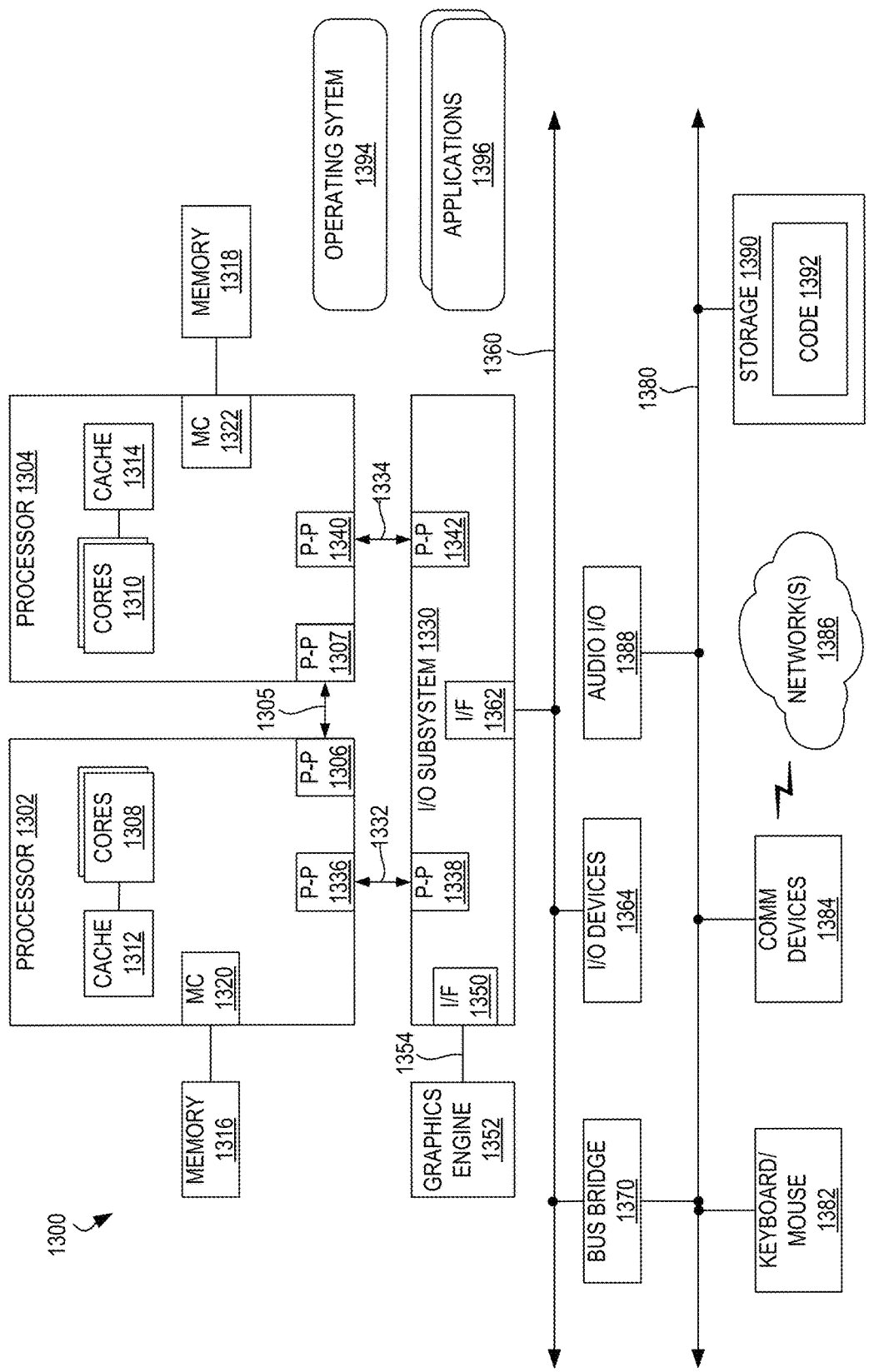
FIG. 13 is a block diagram of an example computing system with which the thermal conduction bands can be utilized.

FIG. 13 is a block diagram of an example computing system with which the thermal conduction bands can be utilized. Generally, components shown in FIG. 13 can communicate with other shown components, although not all connections are shown, for ease of illustration. The computing system 1300 is a multiprocessor system comprising a first processor unit 1302 and a second processor unit 1304 comprising point-to-point (P-P) interconnects. A point-to-point (P-P) interface 1306 of the processor unit 1302 is coupled to a point-to-point interface 1307 of the processor unit 1304 via a point-to-point interconnection 1305. It is to be understood that any or all of the point-to-point interconnects illustrated in FIG. 13 can be alternatively implemented as a multi-drop bus, and that any or all buses illustrated in FIG. 13 could be replaced by point-to-point interconnects.

The processor units 1302 and 1304 comprise multiple processor cores. Processor unit 1302 comprises processor cores 1308 and processor unit 1304 comprises processor cores 1310. Processor cores 1308 and 1310 can execute computer-executable instructions.

Processor units 1302 and 1304 further comprise cache memories 1312 and 1314, respectively. The cache memories 1312 and 1314 can store data (e.g., instructions) utilized by one or more components of the processor units 1302 and 1304, such as the processor cores 1308 and 1310. The cache memories 1312 and 1314 can be part of a memory hierarchy for the computing system 1300. For example, the cache memories 1312 can locally store data that is also stored in a memory 1316 to allow for faster access to the data by the processor unit 1302. In some embodiments, the cache memories 1312 and 1314 can comprise multiple cache levels, such as level 1 (L1), level 2 (L2), level 3 (L3), level 4 (L4) and/or other caches or cache levels. In some embodiments, one or more levels of cache memory (e.g., L2, L3, L4) can be shared among multiple cores in a processor unit or among multiple processor units in an integrated circuit component. In some embodiments, the last level of cache memory on an integrated circuit component can be referred to as a last level cache (LLC). One or more of the higher levels of cache levels (the smaller and faster caches) in the memory hierarchy can be located on the same integrated circuit die as a processor core and one or more of the lower cache levels (the larger and slower caches) can be located on an integrated circuit dies that are physically separate from the processor core integrated circuit dies.

Although the computing system 1300 is shown with two processor units, the computing system 1300 can comprise any number of processor units. Further, a processor unit can comprise any number of processor cores. A processor unit can take various forms such as a central processing unit (CPU), a graphics processing unit (GPU), general-purpose GPU (GPGPU), accelerated processing unit (APU), field-programmable gate array (FPGA), neural network processing unit (NPU), data processor unit (DPU), accelerator (e.g., graphics accelerator, digital signal processor (DSP), compression accelerator, artificial intelligence (AI) accelerator), controller, or other types of processing units. As such, the processor unit can be referred to as an XPU (or xPU). Further, a processor unit can comprise one or more of these various types of processing units. In some embodiments, the computing system comprises one processor unit with multiple cores, and in other embodiments, the computing system comprises a single processor unit with a single core. As used herein, the terms "processor unit" and "processing unit" can refer to any processor, processor core, component, module, engine, circuitry, or any other processing element described or referenced herein.

In some embodiments, the computing system 1300 can comprise one or more processor units that are heterogeneous or asymmetric to another processor unit in the computing system. There can be a variety of differences between the processing units in a system in terms of a spectrum of metrics of merit including architectural, microarchitectural, thermal, power consumption characteristics, and the like. These differences can effectively manifest themselves as asymmetry and heterogeneity among the processor units in a system.

The processor units 1302 and 1304 can be located in a single integrated circuit component (such as a multi-chip package (MCP) or multi-chip module (MCM)) or they can be located in separate integrated circuit components. An integrated circuit component comprising one or more processor units can comprise additional components, such as embedded DRAM, stacked high bandwidth memory (HBM), shared cache memories (e.g., L3, L4, LLC), input/output (I/O) controllers, or memory controllers. Any of the additional components can be located on the same integrated circuit die as a processor unit, or on one or more integrated circuit dies separate from the integrated circuit dies comprising the processor units. In some embodiments, these separate integrated circuit dies can be referred to as "chiplets". In some embodiments where there is heterogeneity or asymmetry among processor units in a computing system, the heterogeneity or asymmetric can be among processor units located in the same integrated circuit component. In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Processor units 1302 and 1304 further comprise memory controller logic (MC) 1320 and 1322. As shown in FIG. 13, MCs 1320 and 1322 control memories 1316 and 1318 coupled to the processor units 1302 and 1304, respectively. The memories 1316 and 1318 can comprise various types of volatile memory (e.g., dynamic random-access memory (DRAM), static random-access memory (SRAM)) and/or non-volatile memory (e.g., flash memory, chalcogenide-based phase-change non-volatile memories), and comprise one or more layers of the memory hierarchy of the computing system. While MCs 1320 and 1322 are illustrated as being integrated into the processor units 1302 and 1304, in alternative embodiments, the MCs can be external to a processor unit.

Processor units 1302 and 1304 are coupled to an Input/Output (I/O) subsystem 1330 via point-to-point interconnections 1332 and 1334. The point-to-point interconnection 1332 connects a point-to-point interface 1336 of the processor unit 1302 with a point-to-point interface 1338 of the I/O subsystem 1330, and the point-to-point interconnection 1334 connects a point-to-point interface 1340 of the processor unit 1304 with a point-to-point interface 1342 of the I/O subsystem 1330. Input/Output subsystem 1330 further includes an interface 1350 to couple the I/O subsystem 1330 to a graphics engine 1352. The I/O subsystem 1330 and the graphics engine 1352 are coupled via a bus 1354.

The Input/Output subsystem 1330 is further coupled to a first bus 1360 via an interface 1362. The first bus 1360 can be a Peripheral Component Interconnect Express (PCIe) bus or any other type of bus. Various I/O devices 1364 can be coupled to the first bus 1360. A bus bridge 1370 can couple the first bus 1360 to a second bus 1380. In some embodiments, the second bus 1380 can be a low pin count (LPC) bus. Various devices can be coupled to the second bus 1380 including, for example, a keyboard/mouse 1382, audio I/O devices 1388, and a storage device 1390, such as a hard disk drive, solid-state drive, or another storage device for storing computer-executable instructions (code) 1392 or data. The code 1392 can comprise computer-executable instructions for performing methods described herein. Additional components that can be coupled to the second bus 1380 include communication device(s) 1384, which can provide for communication between the computing system 1300 and one or more wired or wireless networks 1386 (e.g. Wi-Fi, cellular, or satellite networks) via one or more wired or wireless communication links (e.g., wire, cable, Ethernet connection, radio-frequency (RF) channel, infrared channel, Wi-Fi channel) using one or more communication standards (e.g., IEEE 1302.11 standard and its supplements).

In embodiments where the communication devices 1384 support wireless communication, the communication devices 1384 can comprise wireless communication components coupled to one or more antennas to support communication between the computing system 1300 and external devices. The wireless communication components can support various wireless communication protocols and technologies such as Near Field Communication (NFC), IEEE 1002.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM), and 5G broadband cellular technologies. In addition, the wireless modems can support communication with one or more cellular networks for data and voice communications within a single cellular network, between cellular networks, or between the computing system and a public switched telephone network (PSTN).

The system 1300 can comprise removable memory such as flash memory cards (e.g., SD (Secure Digital) cards), memory sticks, Subscriber Identity Module (SIM) cards). The memory in system 1300 (including caches 1312 and 1314, memories 1316 and 1318, and storage device 1390) can store data and/or computer-executable instructions for executing an operating system 1394 and application programs 1396. Example data includes web pages, text messages, images, sound files, or other data sets to be sent to and/or received from one or more network servers or other devices by the system 1300 via the one or more wired or wireless networks 1386, or for use by the system 1300. The system 1300 can also have access to external memory or storage (not shown) such as external hard drives or cloud-based storage.

The operating system 1394 can control the allocation and usage of the components illustrated in FIG. 13 and support the one or more application programs 1396. The application programs 1396 can include common computing system applications (e.g., email applications, calendars, contact managers, web browsers, messaging applications) as well as other computing applications.

The computing system 1300 can support various additional input devices, such as a touchscreen, microphone, monoscopic camera, stereoscopic camera, trackball, touchpad, trackpad, proximity sensor, light sensor, electrocardiogram (ECG) sensor, PPG (photoplethysmogram) sensor, galvanic skin response sensor, and one or more output devices, such as one or more speakers or displays. Other possible input and output devices include piezoelectric and other haptic I/O devices. Any of the input or output devices can be internal to, external to, or removably attachable with the system 1300. External input and output devices can communicate with the system 1300 via wired or wireless connections.

The system 1300 can further include at least one input/output port comprising physical connectors (e.g., USB, IEEE 1394 (FireWire), Ethernet, RS-232), a power supply (e.g., battery), a global satellite navigation system (GNSS) receiver (e.g., GPS receiver); a gyroscope; an accelerometer; and/or a compass. A GNSS receiver can be coupled to a GNSS antenna. The computing system 1300 can further comprise one or more additional antennas coupled to one or more additional receivers, transmitters, and/or transceivers to enable additional functions.

It is to be understood that FIG. 13 illustrates only one example computing system architecture. Computing systems based on alternative architectures can be used to implement technologies described herein. For example, instead of the processors 1302 and 1304 and the graphics engine 1352 being located on discrete integrated circuits, a computing system can comprise an SoC (system-on-a-chip) integrated circuit incorporating multiple processors, a graphics engine, and additional components. Further, a computing system can connect its constituent component via bus or point-to-point configurations different from that shown in FIG. 13. Moreover, the illustrated components in FIG. 13 are not required or all-inclusive, as shown components can be removed and other components added in alternative embodiments.

It is to be understood that FIG. 13 illustrates only one example computing system architecture. Computing systems based on alternative architectures can be used to implement technologies described herein. For example, instead of the processors 1302 and 1304 and the graphics engine 1352 being located on discrete integrated circuits, a computing system can comprise an SoC (system-on-a-chip) integrated circuit incorporating multiple processors, a graphics engine, and additional components. Further, a computing system can connect its constituent component via bus or point-to-point configurations different from that shown in FIG. 13. Moreover, the illustrated components in FIG. 13 are not required or all-inclusive, as shown components can be removed and other components added in alternative embodiments.

Figure 14:
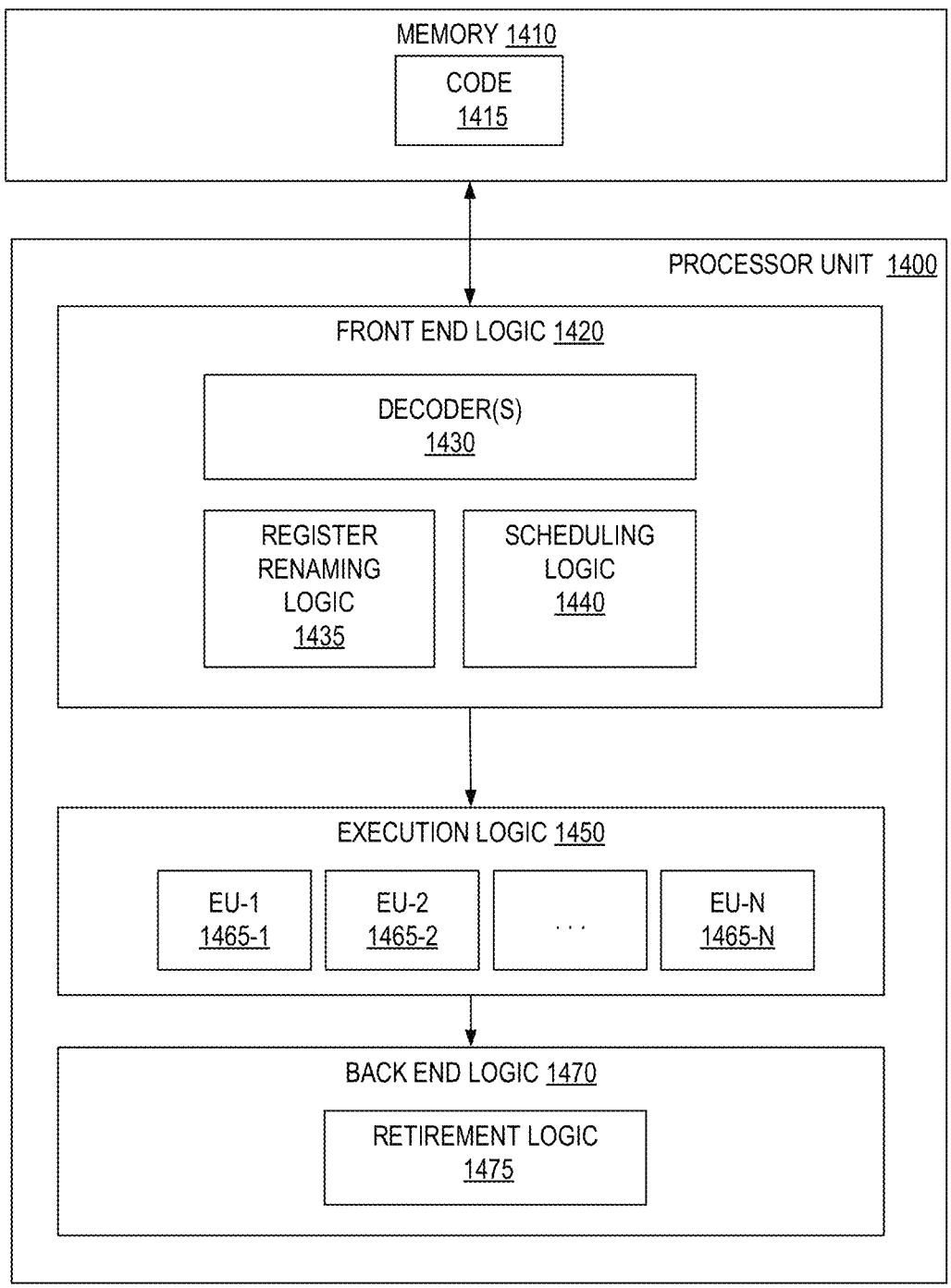
FIG. 14 is a block diagram of an example processor unit to execute computer-executable instructions as part of implementing technologies described herein.

FIG. 14 is a block diagram of an example processor unit 1400 to execute computer-executable instructions as part of implementing technologies described herein. The processor unit 1400 can be a single-threaded core or a multithreaded core in that it may include more than one hardware thread context (or "logical processor") per processor unit.

FIG. 14 also illustrates a memory 1410 coupled to the processor unit 1400. The memory 1410 can be any memory described herein or any other memory known to those of skill in the art. The memory 1410 can store computer-executable instructions 1415 (code) executable by the processor unit 1400.

The processor unit comprises front-end logic 1420 that receives instructions from the memory 1410. An instruction can be processed by one or more decoders 1430. The decoder 1430 can generate as its output a micro-operation such as a fixed width micro operation in a predefined format, or generate other instructions, microinstructions, or control signals, which reflect the original code instruction. The front-end logic 1420 further comprises register renaming logic 1435 and scheduling logic 1440, which generally allocate resources and queues operations corresponding to converting an instruction for execution.

The processor unit 1400 further comprises execution logic 1450, which comprises one or more execution units (EUs) 1465-1 through 1465-N. Some processor unit embodiments can include a number of execution units dedicated to specific functions or sets of functions. Other embodiments can include only one execution unit or one execution unit that can perform a particular function. The execution logic 1450 performs the operations specified by code instructions. After completion of execution of the operations specified by the code instructions, back-end logic 1470 retires instructions using retirement logic 1475. In some embodiments, the processor unit 1400 allows out of order execution but requires in-order retirement of instructions. Retirement logic 1475 can take a variety of forms as known to those of skill in the art (e.g., re-order buffers or the like).

The processor unit 1400 is transformed during execution of instructions, at least in terms of the output generated by the decoder 1430, hardware registers and tables utilized by the register renaming logic 1435, and any registers (not shown) modified by the execution logic 1450.

As used herein, the term "module" refers to logic that may be implemented in a hardware component or device, software or firmware running on a processor unit, or a combination thereof, to perform one or more operations consistent with the present disclosure. Software and firmware may be embodied as instructions and/or data stored on non-transitory computer-readable storage media. As used herein, the term "circuitry" can comprise, singly or in any combination, non-programmable (hardwired) circuitry, programmable circuitry such as processor units, state machine circuitry, and/or firmware that stores instructions executable by programmable circuitry. Modules described herein may, collectively or individually, be embodied as circuitry that forms a part of a computing system. Thus, any of the modules can be implemented as circuitry. A computing system referred to as being programmed to perform a method can be programmed to perform the method via software, hardware, firmware, or combinations thereof.

Any of the disclosed methods (or a portion thereof) can be implemented as computer-executable instructions or a computer program product. Such instructions can cause a computing system or one or more processor units capable of executing computer-executable instructions to perform any of the disclosed methods. As used herein, the term "computer" refers to any computing system, device, or machine described or mentioned herein as well as any other computing system, device, or machine capable of executing instructions. Thus, the term "computer-executable instruction" refers to instructions that can be executed by any computing system, device, or machine described or mentioned herein as well as any other computing system, device, or machine capable of executing instructions.

The computer-executable instructions or computer program products as well as any data created and/or used during implementation of the disclosed technologies can be stored on one or more tangible or non-transitory computer-readable storage media, such as volatile memory (e.g., DRAM, SRAM), non-volatile memory (e.g., flash memory, chalcogenide-based phase-change non-volatile memory) optical media discs (e.g., DVDs, CDs), and magnetic storage (e.g., magnetic tape storage, hard disk drives). Computer-readable storage media can be contained in computer-readable storage devices such as solid-state drives, USB flash drives, and memory modules. Alternatively, any of the methods disclosed herein (or a portion) thereof may be performed by hardware components comprising non-programmable circuitry. In some embodiments, any of the methods herein can be performed by a combination of non-programmable hardware components and one or more processing units executing computer-executable instructions stored on computer-readable storage media.

The computer-executable instructions can be part of, for example, an operating system of the computing system, an application stored locally to the computing system, or a remote application accessible to the computing system (e.g., via a web browser). Any of the methods described herein can be performed by computer-executable instructions performed by a single computing system or by one or more networked computing systems operating in a network environment. Computer-executable instructions and updates to the computer-executable instructions can be downloaded to a computing system from a remote server.

Further, it is to be understood that implementation of the disclosed technologies is not limited to any specific computer language or program. For instance, the disclosed technologies can be implemented by software written in C++, C#, Java, Perl, Python, JavaScript, Adobe Flash, C#, assembly language, or any other programming language. Likewise, the disclosed technologies are not limited to any particular computer system or type of hardware.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, cable (including fiber optic cable), magnetic communications, electromagnetic communications (including RF, microwave, ultrasonic, and infrared communications), electronic communications, or other such communication means.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 includes a system, comprising a mobile computing device comprising a first device portion comprising a first external surface and an integrated circuit component; a second device portion comprising a second external surface; and a hinge to rotatably attach the first device portion to the second device portion; and a band attachable to the mobile computing device, the band comprising a thermally conductive layer, an end of the thermally conductive layer attachable to the first external surface.

Example 2 includes the subject matter of Example 1, and wherein the band is removably attachable to the mobile computing device, the end of the thermally conductive layer removably attachable to the first external surface.

Example 3 includes the subject matter of Example 1, the band further comprising a thermal gap pad positioned at the end of the band, wherein the thermal gap pad is positioned between the end of the thermally conductive layer and the first external surface of the mobile computing device when the band is attached to the mobile computing device.

Example 4 includes the subject matter of Examples 1-3, wherein the end of the thermally conductive layer is a first end of the thermally conductive layer, the thermally conductive layer further comprising a second end opposite the first end of the thermally conductive layer.

Example 5 includes the subject matter of any of Examples 1-4, and wherein the second end of the thermally conductive layer is attachable to the second external surface of the mobile computing device.

Example 6 includes the subject matter of any of Examples 1-5, and wherein the second end of the thermally conductive layer is attachable to the second external surface of the mobile computing device via a hook and loop fastener.

Example 7 includes the subject matter of any of Examples 1-6, and wherein the second end of the thermally conductive layer is attachable to the second external surface of the mobile computing device via an adhesive located on the second end of the thermally conductive layer.

Example 8 includes the subject matter of any of Examples 1-7, and wherein the second end of the thermally conductive layer is removably attachable to the second external surface of the mobile computing device.

Example 9 includes the subject matter of any of Examples 1-8, and wherein the thermal gap pad is a first thermal gap pad, the band further comprising a second thermal gap pad positioned at the second end of the thermally conductive layer, wherein the second thermal gap pad is positioned between the thermally conductive layer and the second external surface of the mobile computing device when the band is attached to the mobile computing device.

Example 10 includes the subject matter of any of Examples 1-9, and wherein the second end extends into a region of an environment located adjacent to the second external surface.

Example 11 includes the subject matter of any one of Examples 4-10, wherein the second end comprises an extension.

Example 12 includes the subject matter of any of Examples 1-11, and wherein the extension extends away from the second external surface of the mobile computing device.

Example 13 includes the subject matter of Example 11 or 12, wherein the extension is flexible to allow the extension to be moved from a first orientation to a second orientation, the extension in the first orientation extending in a direction further away from the mobile computing device than when the extension is in the second orientation.

Example 14 includes the subject matter of Examples 1-13, wherein the end is wedge-shaped and causes an end of the first device portion near the hinge to be lifted up from a surface upon which the mobile computing device can be placed when the band is attached to the mobile computing device.

Example 15 includes the subject matter of Examples 1-14, the band further comprising a magnet, the mobile computing device comprising a ferrous structure, the band removably attached to the mobile computing device at least in part via magnetic attraction of the magnet to the ferrous structure.

Example 16 includes the subject matter of any of Examples 1-15, and wherein the magnet is positioned in the end of the thermally conductive layer and the ferrous structure is positioned in the first device portion.

Example 17 includes the subject matter of Example 15 or 16, wherein the magnet is a first magnet, the ferrous structure is a first ferrous structure, the end of the thermally conductive layer is a first end of the thermally conductive layer, the thermally conductive layer further comprising a second end opposite the first end, the band further comprising a second magnet positioned in the second end of the thermally conductive layer, the mobile computing device further comprising a second ferrous structure positioned in the second device portion, the band further removably attached to the mobile computing device at least in part via magnetic attraction of the second magnet to the second ferrous structure.

Example 18 includes the subject matter of Example 15 or 16, wherein the first device portion comprises a cover comprising the first external surface, the ferrous structure located on an interior surface of the cover.

Example 19 includes the subject matter of Examples 1-19, wherein the band comprises a cutout to accommodate a vent of the mobile computing device.

Example 20 includes the subject matter of any of Examples 1-19, and wherein the end of the thermally conductive layer is attachable to the first external surface of the mobile computing device via a hook and loop fastener.

Example 21 includes the subject matter of any of Examples 1-20, and wherein the end of the thermally conductive layer is attachable to the first external surface of the mobile computing device via an adhesive located on the end of the thermally conductive layer.

Example 22 includes the subject matter of Examples 1-21, wherein the band comprises a cutout to accommodate a vent of the mobile computing device.

Example 23 includes the subject matter of Examples 1-14 and 19, further comprising an attachment means for attaching the band to the mobile computing device.

Example 24 includes the subject matter of Examples 1-23, wherein the band is flexible to accommodate the first device portion being adjustable to be oriented at various angles relative to the second device portion.

Example 25 includes the subject matter of Examples 1-24, wherein the mobile computing device is a laptop computer.

Example 26 includes the subject matter of Examples 1-25, wherein the second device portion comprises a display.

Example 27 includes the subject matter of Examples 1-26, wherein the first device portion comprises a keyboard.

Example 28 includes the subject matter of Examples 1-27, wherein the first device portion comprises a display.

Example 29 includes a method comprising detecting, by a mobile computing device, a thermally conductive band attached to the mobile computing device, the detecting the thermal conduction band attached to the mobile computing device based on sensor data provided by one or more sensors integrated into the mobile computing device; and increasing, by the mobile computing device, a power consumption of an integrated circuit component located in the mobile computing device in response to detecting attachment of the thermally conductive band to the mobile computing device; wherein the mobile computing device comprises a first device portion comprising a first external surface and the integrated circuit component; a second device portion comprising a second external surface; and a hinge to rotatably attach the first device portion to the second device portion; wherein the thermally conductive band comprises a thermally conductive layer, an end of the thermally conductive layer removably attachable to the first external surface.

Example 30 includes the subject matter of Example 29, and wherein the increasing the power consumption of the integrated circuit component comprises increasing a supply voltage or an operational frequency of the integrated circuit component.

Example 31 includes the subject matter of Example 29 or 30, further comprising detecting, by the mobile computing device, detachment of the thermally conductive band from the mobile computing device, the detecting detachment of the thermal conduction band based on the sensor data; and decreasing the power consumption of the integrated circuit component in response to detecting detachment of the thermally conductive band from the mobile computing device.

Example 32 includes the subject matter of any of Examples 29-31, and wherein the decreasing the power consumption of the integrated circuit component comprises reducing a supply voltage or an operational frequency of the integrated circuit component.

Example 33 includes the subject matter of any one of Examples 29-32, wherein the end of the thermally conductive layer is a first end of the thermally conductive layer, the thermally conductive layer further comprising a second end opposite the first end that is removably attachable to the second external surface of the mobile computing device.

Example 34 includes one or more computer-readable storage media storing computer-executable instructions that, when executed, cause one or more processor units of a computing device to perform any one of the methods of Examples 29-33.

Example 35 includes a mobile computing device comprising one or more processor units; and one or more computer-readable storage media storing computer-executable instructions that, when executed, cause the one or more processor units to perform any one of the methods of Examples 29-33.

The invention claimed is:

1. A system, comprising:
   a mobile computing device comprising:
   a first device portion comprising a first external surface and an integrated circuit component;
   a second device portion comprising a second external surface; and
   a hinge to rotatably attach the first device portion to the second device portion; and
   a band attachable to the mobile computing device, the band comprising a thermally conductive layer, an end of the thermally conductive layer attachable to the first external surface, wherein the end of the thermally conductive layer is a first end of the thermally conductive layer, the thermally conductive layer further comprising a second end opposite the first end of the thermally conductive layer, wherein the second end comprises an extension that extends away from the second external surface of the mobile computing device.

2. The system of claim 1, wherein the band is removably attachable to the mobile computing device, the first end of the thermally conductive layer removably attachable to the first external surface.

3. The system of claim 1, the band further comprising a thermal gap pad positioned at the first end of the band, wherein the thermal gap pad is positioned between the first end of the thermally conductive layer and the first external surface of the mobile computing device when the band is attached to the mobile computing device.

4. The system of claim 1, wherein the second end of the thermally conductive layer is attachable to the second external surface of the mobile computing device.

5. The system of claim 1, wherein the second end of the thermally conductive layer is attachable to the second external surface of the mobile computing device via a hook and loop fastener.

6. The system of claim 1, wherein the second end of the thermally conductive layer is attachable to the second external surface of the mobile computing device via an adhesive located on the second end of the thermally conductive layer.

7. The system of claim 4, wherein the second end of the thermally conductive layer is removably attachable to the second external surface of the mobile computing device.

8. The system of claim 4, the band further comprising:
a first thermal gap pad positioned at the first end of the band, wherein the first thermal gap pad is positioned between the first end of the thermally conductive layer and the first external surface of the mobile computing device when the band is attached to the mobile computing device; and
a second thermal gap pad positioned at the second end of the thermally conductive layer, wherein the second thermal gap pad is positioned between the thermally conductive layer and the second external surface of the mobile computing device when the band is attached to the mobile computing device.

9. The system of claim 1, wherein the second end extends into a region of an environment located adjacent to the second external surface.

10. The system of claim 1, wherein the extension is flexible to allow the extension to be moved from a first orientation to a second orientation, the extension in the first orientation extending in a direction further away from the mobile computing device than when the extension is in the second orientation.

11. The system of claim 1, wherein the first end of the thermally conductive layer is wedge-shaped and causes an end of the first device portion near the hinge to be lifted up from a surface upon which the mobile computing device can be placed when the band is attached to the mobile computing device.

12. The system of claim 1, the band further comprising a magnet, the mobile computing device comprising a ferrous structure, the band removably attached to the mobile computing device at least in part via magnetic attraction of the magnet to the ferrous structure.

13. The system of claim 12, wherein the magnet is positioned in the first end of the thermally conductive layer and the ferrous structure is positioned in the first device portion.

14. The system of claim 12, wherein the magnet is a first magnet, the ferrous structure is a first ferrous structure, the band further comprising a second magnet positioned in the second end of the thermally conductive layer, the mobile computing device further comprising a second ferrous structure positioned in the second device portion, the band further removably attached to the mobile computing device at least in part via magnetic attraction of the second magnet to the second ferrous structure.

15. The system of claim 12, wherein the first device portion comprises a cover comprising the first external surface, the ferrous structure located on an interior surface of the cover.

16. The system of claim 1, wherein the first end of the thermally conductive layer is attachable to the first external surface of the mobile computing device via a hook and loop fastener.

17. The system of claim 1, wherein the first end of the thermally conductive layer is attachable to the first external surface of the mobile computing device via an adhesive located on the first end of the thermally conductive layer.

18. The system of claim 1, further comprising an attachment means for attaching the band to the mobile computing device.

19. The system of claim 1, wherein the band is flexible to accommodate the first device portion being adjustable to be oriented at various angles relative to the second device portion.

20. The system of claim 1, wherein the mobile computing device is a laptop computer.

21. The system of claim 1, wherein the second device portion comprises a display.

22. The system of claim 1, wherein the first device portion comprises a keyboard.

* * * * *